US009335387B2

(12) United States Patent
Chen et al.

(10) Patent No.: US 9,335,387 B2
(45) Date of Patent: May 10, 2016

(54) VENTILATION METHOD AND VENTILATION SYSTEM FOR A MAGNETIC RESONANCE IMAGING SYSTEM

(75) Inventors: Li Ming Chen, Shenzhen (CN); Ting Qiang Xue, Shenzhen (CN); Wei Gao, Shenzhen (CN); Ke Cheng Liu, Hangzhou (CN)

(73) Assignee: SIEMENS AKTIENGESELLSCHAFT, München (DE)

( * ) Notice: Subject to any disclaimer, the term of this patent is extended or adjusted under 35 U.S.C. 154(b) by 2494 days.

(21) Appl. No.: 12/150,583

(22) Filed: Apr. 29, 2008

(65) Prior Publication Data

US 2008/0314566 A1 Dec. 25, 2008

(30) Foreign Application Priority Data

Apr. 30, 2007 (CN) .......................... 2007 1 0098953

(51) Int. Cl.
*F28D 15/00* (2006.01)
*G01R 33/28* (2006.01)

(52) U.S. Cl.
CPC .............. *G01R 33/28* (2013.01); *G01R 33/288* (2013.01)

(58) Field of Classification Search
USPC .............................. 454/251, 338; 165/104.33
See application file for complete search history.

(56) References Cited

U.S. PATENT DOCUMENTS 864,265 A * 8/1907 Rosenberg .................... 416/171
1,301,056 A * 4/1919 Hurtt et al. .................... 415/202
4,598,632 A * 7/1986 Johnson, III .................. 454/292
4,907,654 A * 3/1990 Eberhardt ...................... 169/70
4,976,319 A * 12/1990 Eberhardt et al. ............. 169/54
5,013,214 A * 5/1991 Kapich ......................... 415/202
5,125,797 A * 6/1992 Kapich ......................... 415/202
5,249,923 A * 10/1993 Negus .......................... 415/202
6,516,282 B2 * 2/2003 Hedlund et al. ............. 702/132
6,909,283 B2 * 6/2005 Emeric et al. ................ 324/300
6,992,483 B1 * 1/2006 Emeric et al. ................ 324/300
7,015,692 B2 * 3/2006 Clarke et al. ................. 324/300
7,301,343 B1 * 11/2007 Sellers et al. ................ 324/318
7,368,913 B2 * 5/2008 Sellers et al. ................ 324/318
7,570,058 B1 * 8/2009 Wong et al. .................. 324/318
7,602,185 B2 * 10/2009 Nozaki ......................... 324/315
8,641,493 B2 * 2/2014 Wohlfarth ............. G01R 33/28 454/254
2005/0252219 A1 * 11/2005 Van Hasselt ........................ 62/6
2006/0220646 A1 * 10/2006 Kurome et al. ............... 324/318
2010/0188083 A1 * 7/2010 Cao et al. ...................... 324/307
2010/0315086 A1 * 12/2010 Sakakura ...................... 324/318

FOREIGN PATENT DOCUMENTS

JP 08182662 * 7/1996 ............. A61B 5/055

* cited by examiner

*Primary Examiner* — Alissa Tompkins
*Assistant Examiner* — Phillip E Decker

(57) ABSTRACT

This invention discloses a ventilation system for an MRI system, including: a hydrodynamic rotating device, a primary coolant water pipe, a secondary coolant water pipe, a fan and air outlet; the water outlet of the primary coolant water pipe is connected to the water inlet of the hydrodynamic rotating device, while the water inlet of the secondary coolant water pipe is connected to the water outlet of the hydrodynamic rotating device; with the impetus provided by the coolant water from the primary coolant water pipe, the hydrodynamic rotating device drives the fan near the air outlet to rotate, discharging the coolant water into the secondary coolant water pipe. Furthermore, the invention discloses a ventilation method for an MRI system. Ventilation efficiency is improved significantly with the system and method provided by this invention.

12 Claims, 4 Drawing Sheets

100
130
150
140
120
160
90
80
110
10
30
40
20

VENTILATION METHOD AND VENTILATION SYSTEM FOR A MAGNETIC RESONANCE IMAGING SYSTEM

CROSS REFERENCE TO RELATED APPLICATIONS

This application claims priority of Chinese application No. 200710098953.6 filed Apr. 30, 2007, which is incorporated by reference herein in its entirety.

FIELD OF THE INVENTION

This invention relates to the field of MRI (Magnetic Resonance Imaging), and especially relates to a kind of ventilation method and ventilation system for the MRI system.

BACKGROUND OF THE INVENTION

MRI systems, especially high field cavity magnet MRI systems, have always been widely accepted due to their high imaging quality and comprehensive functionalities. However, due to the structural characteristics of the magnet in a high field MRI system, the imaging zone is an enclosed cavity, causing some patients to feel a strong sense of confinement, which affects its clinical application. In order to increase the comfort of the patient lying in the closed magnet cavity, a ventilation system is usually installed to provide fresh air to the patient.

At present, the ventilation system for the MRI system often features a motor driven fan, as shown in FIG. 1, a structural diagram of an MRI system and its ventilation system according to the prior art. In FIG. 1, the MRI system consists of a cavity magnet (10), a gradient coil (20) close to the cavity magnet (10) and an enclosure (30), with an air outlet (40) in the enclosure close to the upper side of the patient's head. The ventilation system consists of a motor (50), a centrifugal fan (60) and an air duct (70), wherein the motor (50) drives the centrifugal fan (60), and sends airflow to the air outlet (40) of the MRI system through the air duct (70). However, because the motor (50) contains many magnetic components which can severely affect the evenness of the magnetic field of the MRI system's magnet (10), this can only be installed far from the cavity center of the magnet (10), as shown in FIG. 1. This lengthens the air duct (70) from the ventilation system to the air outlet (40) of the magnet cavity, thus leading to greater ventilation resistance, attenuated air volume and lower ventilation efficiency.

In addition, the system is complicated in terms of structure and more expensive in terms of cost due to severe electromagnetic interference from the running motor upon the MRI system, which requires the design of a special shielding device, and also due to the need of the motor for a special power supply such as an AC transformer and a rectifier, which are very large in size, and furthermore, the need for a special shielding device with consideration to electromagnetic compatibility with the magnet.

SUMMARY OF THE INVENTION

The invention provides a ventilation system for the magnetic resonance imaging system on the one hand, and provides a ventilation method for the magnetic resonance imaging system on the other hand in order to improve ventilation efficiency.

The ventilation system for the magnetic resonance imaging system provided by the invention consists of a hydrodynamic rotating device, a primary coolant water pipe, a secondary coolant water pipe, a fan and an air outlet, where, The outlet of said primary coolant water pipe is connected with the water inlet of said hydrodynamic rotating device, and the water inlet of said secondary coolant water pipe is connected with the water outlet of said rotating device;

Driven by coolant water from the primary coolant water pipe, said hydrodynamic rotating device rotates the fan close to the air outlet and meanwhile discharges coolant water to the secondary coolant water pipe.

Wherein said hydrodynamic rotating device drives said fan to rotate through a constant speed or variable speed drive mechanism, or drives said fan to rotate directly.

Wherein said drive mechanism is a drive shaft, belt drive mechanism, gear drive mechanism, or a chain drive mechanism.

Preferably, the system consists further of a relief valve or a flow valve on the primary coolant water pipe which can control the pressure or flow of said coolant water stream according to the requirement for ventilation speed.

In addition, the system also includes a coolant water main intake path, coolant water main reflux path, a splitting device and a collecting device, wherein:

Said splitting device connects said coolant water main intake path and the water inlet of said primary coolant water pipe, so that part of the coolant water in the coolant water main intake path is split to the primary coolant water pipe;

Said collecting device connects the water outlet of said secondary coolant water with the coolant water main reflux path, and directs the coolant water from the secondary coolant water pipe into said coolant water main reflux path.

Alternatively, the system also includes a coolant water main intake path, and there is a break point in said coolant water main intake path. The water outlet of said break point is connected with said primary coolant water pipe and the water inlet of said break point is connected with said secondary coolant water pipe.

Alternatively, the system also includes a coolant water main intake path, a change valve and a T-piece;

Said change valve is installed between said coolant water main intake path and said primary coolant water pipe, which controls the flow of coolant water in the coolant water main intake path into said primary coolant water pipe according to the need for ventilation;

Said T-piece is installed between the coolant water main intake path and said secondary coolant water pipe, which directs the coolant water from said secondary coolant water pipe into said coolant water main intake path.

Wherein said splitting device is a T-piece, bypass valve or a copper water separator while said collecting device is a T-piece or a collecting valve.

Wherein said hydrodynamic rotating device is an impeller device or a hydraulic turbine device.

Wherein said fan is an axial flow fan or a centrifugal fan.

The ventilation method for the magnetic resonance imaging system provided by the present invention features a hydrodynamic rotating device connected with a coolant water source in the MRI system in advance, and a fan connected to said hydrodynamic rotating device close to the air outlet. The method includes the use of said coolant water in the MRI system to drive said hydrodynamic rotating device and rotate said fan close to the air outlet.

Wherein the method for using the coolant water in the MRI system to drive said hydrodynamic rotating device and rotate the fan close to the air outlet is as follows:

Some coolant water from the coolant water main intake path of the MRI system is split and input to the inlet of the hydrodynamic rotating device as a power source to drive said hydrodynamic rotating device and rotate said fan close to the air outlet, and meanwhile, water flows out of the water outlet of the hydrodynamic rotating device and enters the coolant water main reflux path of the MRI.

Preferably, the system also includes: control of the pressure or flow of the above coolant current according to ventilation requirements.

It can be seen from the above scheme that the invention uses the existing coolant water in the MRI as a power source to drive the rotating shaft of the hydrodynamic rotating device. Since this functional mechanism has good electromagnetic compatibility with the magnet, the ventilation fan can be installed close to the air outlet and driven by the rotating shaft of the hydrodynamic rotating device to provide fresh air to the patient in the magnet cavity. The energy supply mechanism is not only simple but also avoids the disadvantages such as long air ducts and low ventilation efficiency found in traditional ventilation systems which require consideration of the electromagnetic compatibility of the motor and the magnet and the installation of a ventilation system far away from the cavity center of the magnet, and improves ventilation efficiency.

Furthermore, a relief valve or flow valve is used to control the power source and adjust ventilation speed, which overcomes the disadvantages of traditional ventilation systems such as complex ventilation speed adjustment circuits, and its speed adjustment mechanism is simple, flexible and low-cost.

Additionally, the use of a variable speed drive mechanism can change the power source supply flexibly to meet the ventilation requirements.

BRIEF DESCRIPTION OF THE DRAWINGS

The above-mentioned and other features and advantages of the invention will become apparent to those of ordinary skill in the art from the following description of preferred embodiments of the invention with reference to the attached drawings, wherein.

DETAILED DESCRIPTION OF THE INVENTION

In order to clarify the objects, technical solutions and advantages of the invention, the invention will be described in detail below with reference to the drawings and embodiments.

In one embodiment of the invention, the coolant water of the MRI system is used as a power source to drive the rotating shaft of the hydrodynamic rotating device, and the rotating shaft forces the fan close to the air outlet to rotate.

Figure 1:
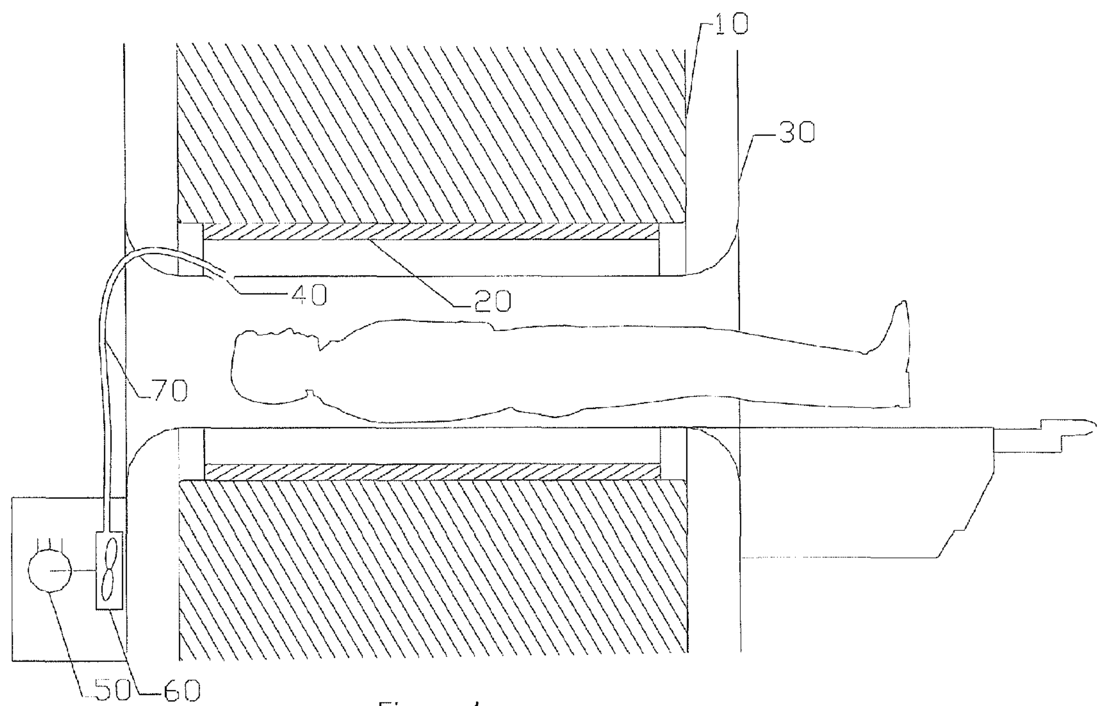
FIG. 1 is a structural diagram of an MRI system and its ventilation system according to the prior art.
Figure 2:
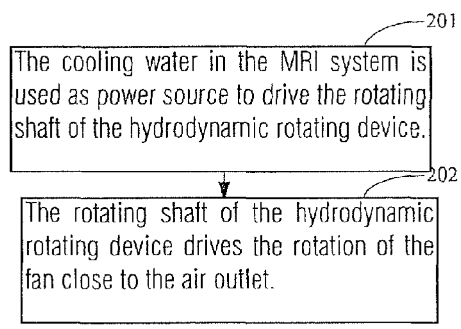
FIG. 2 is a flow chart of the ventilation method for the MRI system of the invention.

See FIG. 2, which is a flow chart of the ventilation method for the MRI system of the invention. As shown in FIG. 2, the flow includes following steps:

Step 201 uses coolant water in the MRI system as a power source to drive the rotating shaft of the hydrodynamic rotating device.

In the present embodiment, this step may include the following steps: the use of a T-piece or bypass valve to divert some coolant water from the coolant water main intake path of the MRI system, and input this to the inlet of the hydrodynamic rotating device through the primary coolant water pipe and drive the hydrodynamic rotating device power source, and meanwhile, water flows out of the outlet of the hydrodynamic rotating device and enters the coolant water main reflux path of the MRI through the secondary coolant water pipe and T-piece or collecting valve.

In this case, in order to adjust the ventilation speed, a relief valve or flow valve can be installed in the primary coolant water pipe, so as to control the supply of the power source, and thereby control the ventilation speed. Alternatively, if a bypass valve is installed, the supply to the power source can be adjusted by controlling the diversion volume of the bypass valve. Since the output power for the coolant water driving the impeller is proportional to the water pressure and flow, i.e. $W \propto p_{water} \times f_{water}$, $p_{water}$ (Pascal=N/m$^2$) is the water pressure of the coolant water, and $f_{water}$(m$^3$/s) is the flow of the coolant water. Therefore, adjustments to the ventilation speed can be achieved in a simple and convenient way by adjusting the pressure or flow of the coolant water. The water pressure can be adjusted by controlling the relief valve, while the flow can be adjusted by controlling the flow valve.

Alternatively, this step may include the following content: coolant water is input into the coolant water main intake path of the MRI system into the water inlet of the hydrodynamic rotating device to drive the hydrodynamic rotating device power source, and meanwhile, water flows out of the water outlet of the hydrodynamic rotating device and continues to serve as coolant water for the MRI system.

In this case, we can cut off the coolant water main intake path of the MRI system at a certain median point and connect the two ends to the water inlet and outlet of the hydrodynamic rotating device respectively. Alternatively, a change valve can be installed between the coolant water main intake path of the MRI system and the water inlet of the hydrodynamic rotating device, and when patients need ventilation, the coolant water is diverted from the coolant water main intake path of the MRI system into the water inlet of the hydrodynamic rotating device so as to drive the hydrodynamic rotating device power source, and meanwhile, water flows out of the outlet of the hydrodynamic rotating device and continues to serve as coolant water for the MRI system. When patients do not require ventilation, the path between the coolant water main intake path of the MRI system and the water inlet of the hydrodynamic rotating device can be closed.

In the present embodiment, the hydrodynamic rotating device can be an impeller device or a hydraulic turbine device.

In Step 202, the rotating shaft of the hydrodynamic rotating device drives the rotation of the fan close to the air outlet.

In the present embodiment, on the one hand, the refrigeration cabinet providing coolant water is installed in the equipment room outside the shielding chamber where the magnet is located, providing good electromagnetic compatibility with the MRI system and magnet; and on the other hand, all static parts of the ventilation system are made of non-magnetic materials such as brass, stainless steel, plastic and porcelain, and all the moving parts are made of non-magnetic non-conductive materials such as plastic and porcelain, thus also providing good electromagnetic compatibility with the MRI system and magnet. Therefore, electromagnetic interference needs do not need to be considered, the hydrodynamic rotating device can be installed near the air outlet, and the ventilation fan can be installed close to the air outlet; for example, the fan can be installed immediately at the air outlet of the magnet cavity, providing a very short air duct, negligible ventilation speed decay, and high ventilation efficiency.

Wherein the rotating shaft of the hydrodynamic rotating device can be directly connected with the fan, for example, they can be connected by a mechanical connecting mechanism such as a coupling, and in this case, the rotating shaft of the hydrodynamic rotating device and the fan can rotate at the same speed. The drive mechanism has a simple structure and is easy to implement. If the ventilation speed is not sufficiently high, a speed changing mechanism can be added to change the supply of power. Wherein the speed changing mechanism can be a stepped speed changing mechanism or a stepless speed changing mechanism.

Therefore, the rotating shaft of the hydrodynamic rotating device can drive the fan to rotate through a constant speed or variable speed drive mechanism, wherein the drive mechanism can be a drive shaft, a belt drive mechanism, a gear drive mechanism, or a chain drive mechanism.

In the present embodiment, the fan can be a ventilation fan such as an axial fan or a centrifugal fan.

The ventilation method for the MRI system in the embodiment of the invention has been described in detail. Next, a detailed description of the ventilation system for the MRI system in the embodiment of the present invention will be provided.

Figure 3:
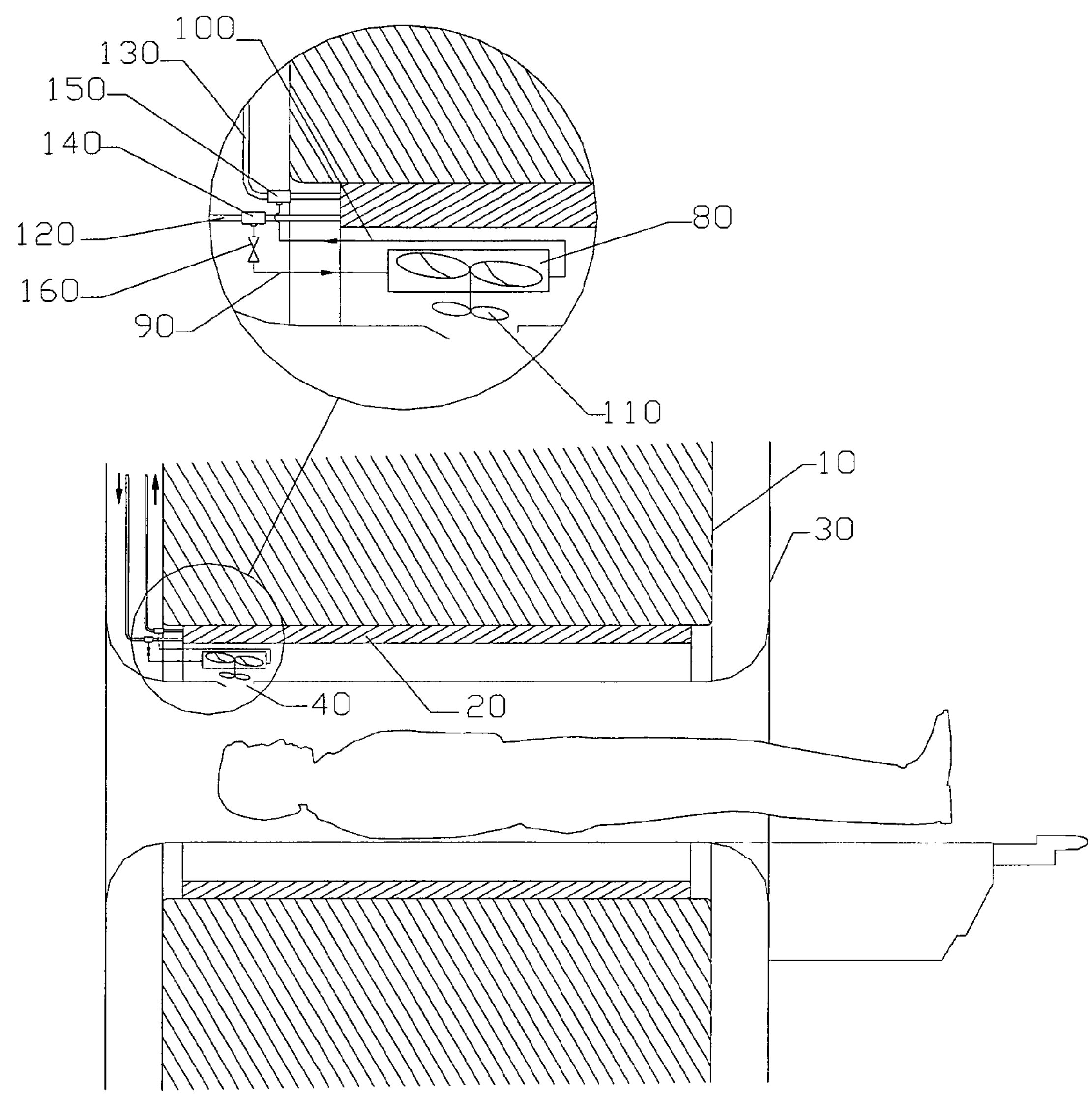
FIGS. 3(*a*) through 3(*c*) are structural diagrams of the MRI system and the ventilation system of the invention.
Figure 3:
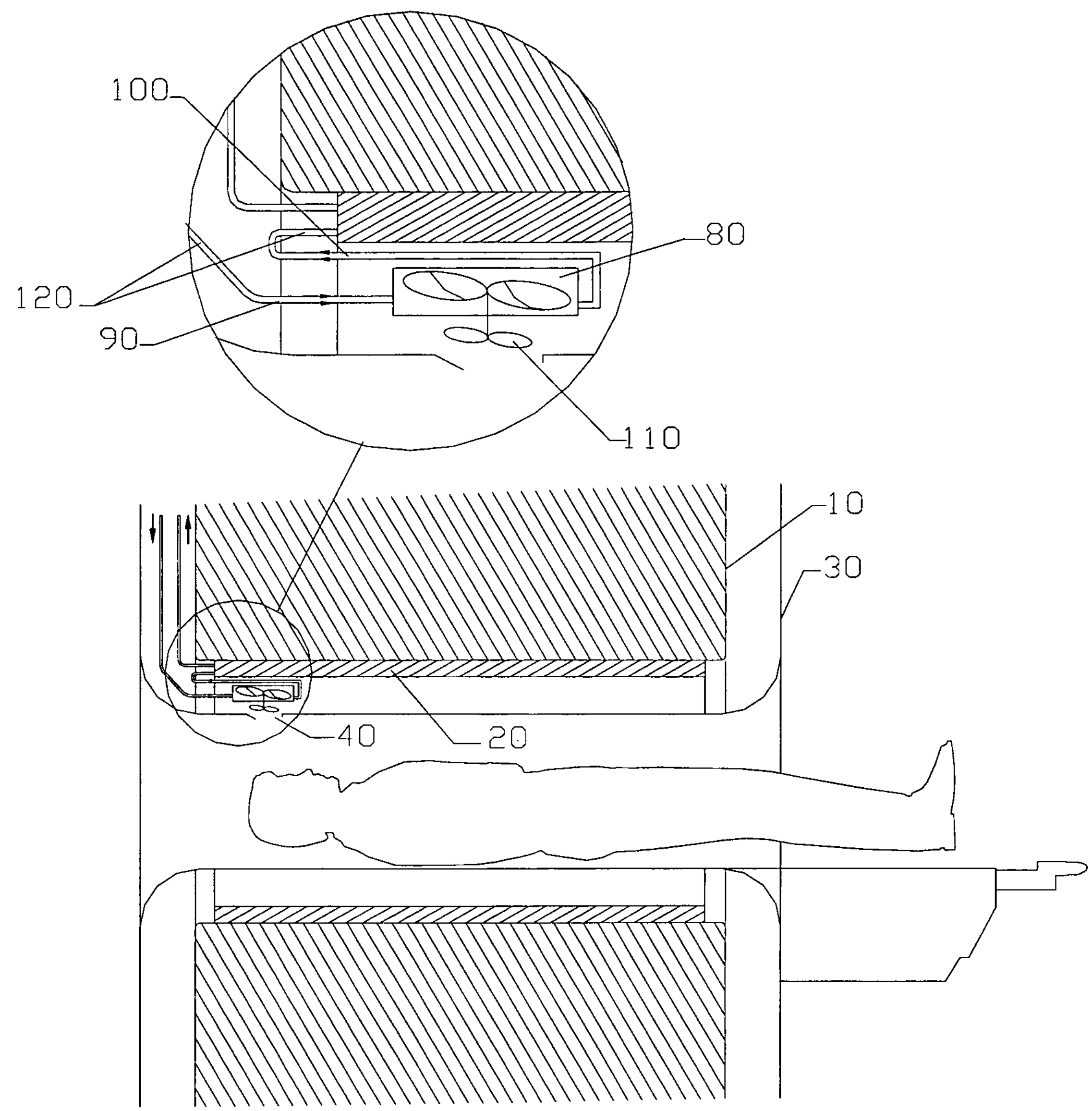
Figure 3:
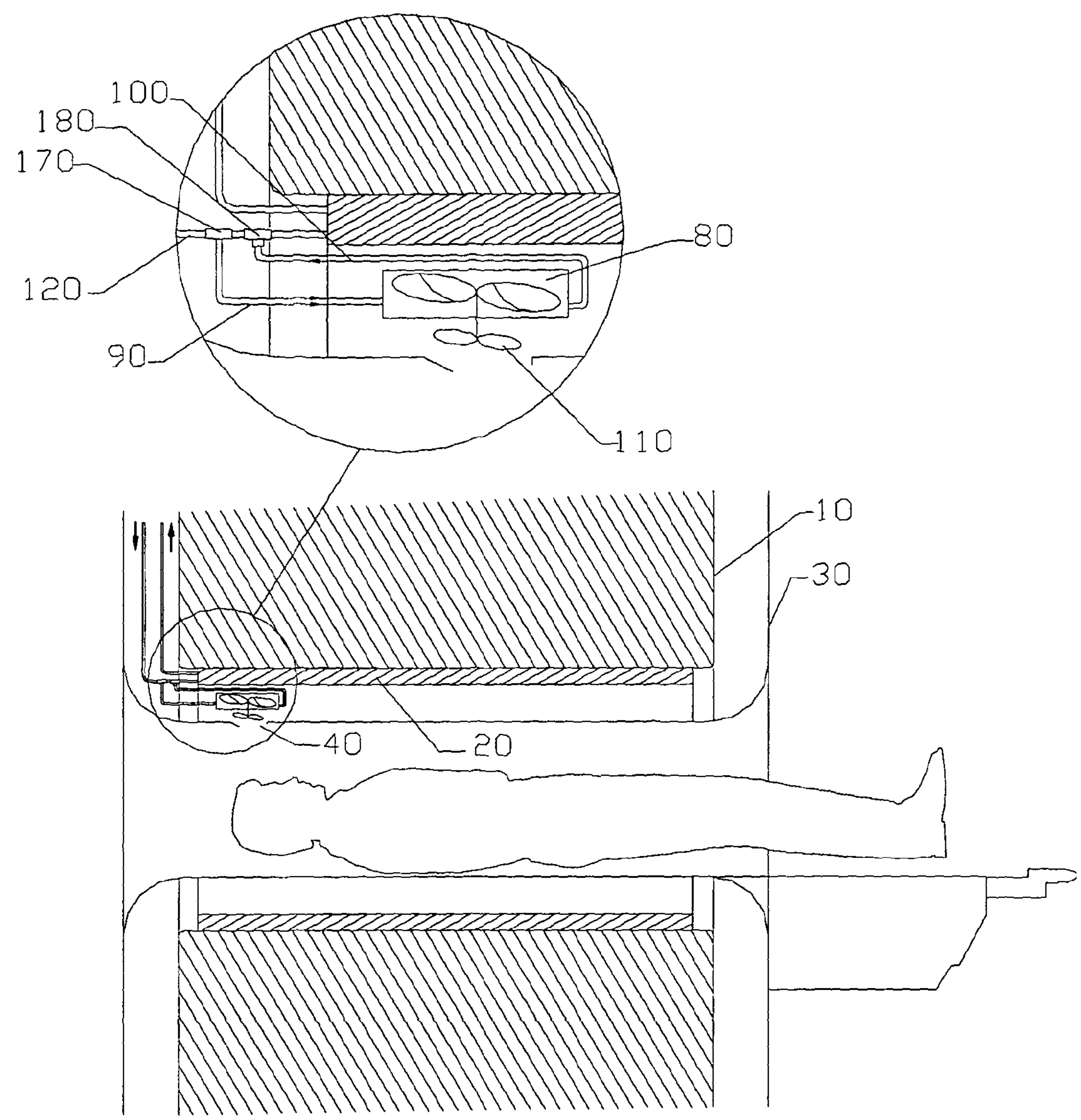

See FIG. 3(*a*) through 3(*c*), which are structural diagrams of the MRI system and the ventilation system in this invention; As shown in FIG. 3A, the ventilation system consists of a hydrodynamic rotating device (80), the primary coolant water pipe in the MRI system (90), a secondary coolant water pipe in the MRI system (100) and a fan (110).

Wherein the water outlet of the primary coolant water pipe (90) in the MRI is connected with the water inlet of the hydrodynamic rotating device (80), the water inlet of the secondary coolant water pipe (100) in the MRI is connected with the water outlet of the hydrodynamic rotating device (80), and the fan (110) is connected with the rotating shaft of the hydrodynamic rotating device (80).

The coolant water in the MRI system flows into the water inlet of the hydrodynamic rotating device (80) through the primary coolant water pipe (90), and drives the hydrodynamic rotating device (80) power source, and meanwhile, water flows out of the water outlet of the hydrodynamic rotating device (80) and enters the secondary coolant water pipe (100) of the MRI system. When the hydrodynamic rotating device (80) rotates, it drives the fan (110) to rotate and provides fresh air for patients in the cavity of the magnet (10).

In the present embodiment as shown in FIG. 3(*a*), we can use a splitting device (140) to connect the coolant water main intake path (120) of the MRI system and the water inlet of the primary coolant water pipe (90) of the MRI system, diverting part of the coolant water from the coolant water main intake path (120) of the MRI system to drive the hydrodynamic rotating device (80) power source; the collecting device (150) is used to connect the water outlet of the secondary coolant water pipe (100) of the MRI system with the coolant water main reflux path of the MRI system (130), allowing the water flowing out of the water outlet of hydrodynamic rotating device (80) to enter the coolant water main reflux path of the MRI system (130). Wherein the splitting device (140) can be a T-piece, a bypass valve or a copper water separator, while the collecting device (150) can be a T-piece or a collecting valve.

Furthermore, a relief valve (160) or a flow valve (160) can be installed in the primary coolant water pipe (90), and the relief valve (160) or flow valve (160) can be adjusted to control the pressure or volume of the water flow, thus adjusting the ventilation speed. If the ventilation speed does not require adjusting, the relief valve (160) or flow valve (160) can be omitted.

Alternatively, in the present embodiment as shown in FIG. 3(*b*), we can break the coolant water main intake path (120) of the MRI system at a certain median point, i.e. design a break point on the coolant water main intake path (120) of the MRI system where the outlet of the break point is directly connected to the primary coolant water pipe (90) of the MRI system; the inlet of the break point is directly connected to the secondary coolant water pipe (100) of the MRI system, and the water in the coolant water main intake path (120) of the MRI system is then input into the water inlet of the hydrodynamic rotating device (80) through the primary coolant water pipe (90) of the MRI system, driving the hydrodynamic rotating device (80) power source, and meanwhile, water flows out of the water outlet of the hydrodynamic rotating device (80) and enters the coolant water main intake path (120) of the MRI system through the secondary coolant water pipe (100) and T-piece (180) to continue to serve as coolant water for the MRI system.

Alternatively, in the present embodiment as shown in FIG. 3(*c*), we can install a change valve (170) between the coolant water main intake path (120) of the MRI system and the primary coolant water pipe (90), and install a T-piece between the coolant water main intake path (120) of the MRI system and the secondary coolant water pipe (100). When patients require ventilation, water is directed into the coolant water main intake path (120) of the MRI system to the primary coolant water pipe (90) using the change valve (170), and then input into the water inlet of the hydrodynamic rotating device (80) to drive the hydrodynamic rotating device (80) power source, after which the water flows out of the water outlet of the hydrodynamic rotating device (80) and enters the coolant water main intake path (120) of the MRI system through the secondary coolant water pipe (100) and T-piece (170) to continue to serve as coolant water for the MRI system. When patients do not require ventilation, the path between the coolant water main intake path (120) of the MRI system and the primary coolant water pipe (90) can be closed using the change valve (170), and the coolant water in the MRI system continues to flow in the coolant main water path as in the prior art.

In addition, the rotating shaft of the hydrodynamic rotating device (80) can be directly connected with the fan (110) using a mechanical connecting mechanism such as a coupling, and the rotating shaft of the hydrodynamic rotating device (80) and fan (110) can then rotate at the same speed. Alternatively, if the ventilation speed is not sufficiently high, a speed changing mechanism can be added to change the supply of power. Wherein the speed changing mechanism can be a stepped speed changing mechanism or a stepless speed changing mechanism, i.e., one end of the drive mechanism is connected with the rotating shaft of the hydrodynamic rotating device (80), and the other end is connected with the fan (110). Wherein said drive mechanism can be a drive shaft, a belt drive mechanism, a gear drive mechanism, or a chain drive mechanism.

Wherein the hydrodynamic rotating device (80) can be an impeller device or another water driven device such as a hydraulic turbine. The fan (110) can be a ventilation fan, such as an axial fan or a centrifugal fan.

The above-mentioned are only preferred embodiments of the invention, which shall not be taken as limitations to the scope of the invention. Under the spirit and principle of the invention, any modification, substitution or improvement shall be considered as within the scope of the invention.

The invention claimed is:

1. A ventilation system for a magnetic resonance imaging (MRI) system, comprising:

a hydrodynamic rotating device;

a primary coolant water pipe having a water outlet connected to a water inlet of the hydrodynamic rotating device;

a secondary coolant water pipe having a water inlet connected to a water outlet of the hydrodynamic rotating device;

a fan; and an air outlet, wherein the hydrodynamic rotating device is configured to drive the fan near the air outlet to rotate under an impetus of a coolant water from the primary coolant water pipe and discharges the coolant water into the secondary coolant water pipe, and wherein at least one of a relief valve and a flow valve is installed on the primary coolant water pipe, and wherein the at least one of a relief valve or a flow valve is configured to adjust a degree of a pressure or a flux of the coolant water based upon a required ventilation speed for the MRI system.

2. The system as claimed in claim 1, wherein the hydrodynamic rotating device drives the fan to rotate directly or through a constant speed or variable speed drive mechanism.

3. The system as claimed in claim 2, wherein the drive mechanism is selected from the group consisting of: a drive shaft, a belt drive mechanism, a gear drive mechanism, and a chain drive mechanism.

4. The system as claimed in claim 1, further comprising:

a coolant water intake main path, a coolant water reflux main path, a splitting device that links the coolant water intake main path to a water inlet of the primary coolant water pipe so that part of the coolant water in the coolant water intake main path flows into the primary coolant water pipe, and a collecting device that links a water outlet of the secondary coolant water pipe to the coolant water reflux main path so that the coolant water from the secondary coolant water pipe flows into the coolant water reflux main path.

5. The system as claimed in claim 4, wherein the splitting device is selected from the group consisting of: a T-piece, a bypass valve, and a copper water separator.

6. The system as claimed in claim 4, wherein the collecting device is a T-piece or a collecting valve.

7. The system as claimed in claim 1, wherein the hydrodynamic rotating device is an impeller device or a hydraulic turbine device.

8. The system as claimed in claim 1, wherein the fan is an axial fan or a centrifugal fan.

9. A ventilation method for a magnetic resonance imaging (MRI) system having a body defining a cavity therein, the method comprising:

connecting a hydrodynamic rotating device to a coolant water pipe having a coolant water flowing therethrough;

connecting the hydrodynamic rotating device to a fan near an air outlet;

rotating the fan by the hydrodynamic rotating device using an impetus of the coolant water in the coolant water pipe to provide an air flow into the cavity of the MRI system;

operating the MRI system; and adjusting a pressure or flux of the coolant water according to a required amount of ventilation for the cavity of the MRI system.

10. The ventilation method as claimed in claim 9, wherein part of the coolant water flows into a water inlet of the hydrodynamic rotating device as a power source to drive the fan to rotate.

11. The ventilation method as claimed in claim 9, wherein the MRI system further comprises a coolant water reflux main path for cooling the MRI system, and wherein the method further comprises:

connecting a secondary coolant water pipe to the outlet of the hydrodynamic rotating device; and connecting the secondary coolant water pipe to the coolant water reflux main path of the MRI system.

12. A magnetic resonance imaging (MRI) system comprising:

a coolant water intake main path;

a coolant water reflux main path;

a hydrodynamic rotating device;

a primary coolant water pipe in communication with the coolant water intake main path and having a water outlet connected to a water inlet of the hydrodynamic rotating device;

a secondary coolant water pipe having a water inlet connected to a water outlet of the hydrodynamic rotating device;

a fan in communication with the hydrodynamic rotating device;

an air outlet, wherein the hydrodynamic rotating device is configured to drive the fan near the air outlet to rotate under an impetus of a coolant water from the primary coolant water pipe and to discharge the coolant water into the secondary coolant water pipe;

a splitting device that links the coolant water intake main path to a water inlet of the primary coolant water pipe so that part of the coolant water in the coolant water intake main path flows into the primary coolant water pipe, and a collecting device that links a water outlet of the secondary coolant water pipe to the coolant water reflux main path of the MRI system so that the coolant water from the secondary coolant water pipe flows into the coolant water reflux main path.

* * * * *